United States Patent
Hayashi (10) Patent No.: US 12,299,530 B2
(45) Date of Patent: May 13, 2025

(54) ELECTRONIC DEVICE, DISPLAY PART, AND INFORMATION READING METHOD FOR THE ELECTRONIC DEVICE

(71) Applicant: DENSO CORPORATION, Kariya (JP)

(72) Inventor: Kunihiko Hayashi, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 18/495,659

(22) Filed: Oct. 26, 2023

(65) Prior Publication Data

US 2024/0054305 A1    Feb. 15, 2024

Related U.S. Application Data (63) Continuation of application No. PCT/JP2022/015027, filed on Mar. 28, 2022.

(30) Foreign Application Priority Data

Apr. 28, 2021    (JP) ................ 2021-076339

(51) Int. Cl.
    *G06K 7/14*      (2006.01)
(52) U.S. Cl.
    CPC ................... *G06K 7/1417* (2013.01)
(58) Field of Classification Search
    CPC .......... G06K 7/1417; G06K 7/10; G06K 7/12; G06K 19/06; G09F 3/00; H05K 5/02
See application file for complete search history.

(56) References Cited

U.S. PATENT DOCUMENTS

2004/0227987 A1    11/2004    Holliday

FOREIGN PATENT DOCUMENTS

| EP | 2247084 B1 * | 2/2012 | .......... G06F 1/3203 |
|---|---|---|---|
| JP | 2-39288 A | 2/1990 | |
| JP | 2514232 B2 | 7/1996 | |
| JP | H10-046135 A | 2/1998 | |
| JP | 2003-181091 A | 7/2003 | |
| JP | 2005-047179 A | 2/2005 | |
| JP | 2007-069566 A | 3/2007 | |
| JP | 2007-229332 A | 9/2007 | |
| JP | 2008-269532 A | 11/2008 | |
| JP | 2009-175800 A | 8/2009 | |
| JP | 4802784 B | 10/2011 | |
| JP | 2012-027493 A | 2/2012 | |

* cited by examiner

*Primary Examiner* — Matthew Mikels
(74) *Attorney, Agent, or Firm* — Maschoff Brennan (57) ABSTRACT

An aspect of the present disclosure provides an electronic device that includes a housing in which an electronic component is disposed. At least part of the housing is configured by a transmission member that transmits at least one of ultraviolet light, visible light, and infrared light, which have different wavelengths. The housing includes therein a display part that displays information concerning the electronic device. The display part is configured to be able to read the information using any of the light that has been emitted from outside of the housing and has passed through the transmission member, and the transmission member has selective transparency having different transmittances to the light depending on a type of the light.

18 Claims, 7 Drawing Sheets

FIG.2A (A) ULTRAVIOLET RAYS, VISIBLE LIGHT < INFRARED RAYS

FIG.2B (B) ULTRAVIOLET RAYS < VISIBLE LIGHT, INFRARED RAYS

FIG.2C

(C) ULTRAVIOLET RAYS > VISIBLE LIGHT, INFRARED RAYS

ELECTRONIC DEVICE, DISPLAY PART, AND INFORMATION READING METHOD FOR THE ELECTRONIC DEVICE

CROSS-REFERENCE TO RELATED APPLICATION

The present application is based on and claims the benefit of priority from earlier Japanese Patent Application No. 2021-076339 filed on Apr. 28, 2021, the description of which is incorporated herein by reference.

BACKGROUND

Technical Field

The present disclosure relates to an electronic device, for example, which is for vehicular use, a display part of the electronic device, and an information reading method for information displayed on the electronic device.

Related Art

Recently, for automobiles, a large number of electronic components including an electronic circuit are used as vehicular components. Information on the electronic components, for example, names of manufacturers, names of the components, part numbers, production time, and information according to various laws is required to be written so that persons who need to see the information such as operators can recognize that clearly.

SUMMARY

An aspect of the present disclosure provides an electronic device that includes a housing in which an electronic component is disposed.

At least part of the housing is configured by a transmission member that transmits at least one of ultraviolet light, visible light, and infrared light, which have different wavelengths. The housing includes therein a display part that displays information concerning the electronic device.

The display part is configured to be able to read the information using any of the light that has been emitted from outside of the housing and has passed through the transmission member, and the transmission member has selective transparency having different transmittances to the light depending on a type of the light.

DETAILED DESCRIPTION OF THE PREFERRED EMBODIMENTS

Recently, for automobiles, a large number of electronic components including an electronic circuit are used as vehicular components. Information on the electronic components, for example, names of manufacturers, names of the components, part numbers, production time, and information according to various laws is required to be written so that persons who need to see the information such as operators can recognize that clearly.

Conventionally, the information is presented by providing a display portion (i.e., display part) depending on the contents of the information by labeling, marking, printing, laser marking, or the like to the outside of a housing (e.g., refer to JP-A-2007-69566), a bracket, or the like.

As a result of detailed studies of the technique described above by the inventor, the following problem is found.

In the technique described above, when the display part is provided to the outside of the housing, the information may not be readable due to dirt or damage of the surface of the display part.

An aspect of the present disclosure provides a technique that can easily read information from a display part that displays information on an electronic component and the like.

Hereinafter, exemplary embodiments of the present disclosure will be described with reference to the drawings.

1. First Embodiment

[1-1. Overall Configuration]

In the first embodiment, as an example of an electronic device, a vehicular electronic control device will be described. Similarly, the present disclosure can also be applied to a vehicular sensor and the like.

Figure 1A:
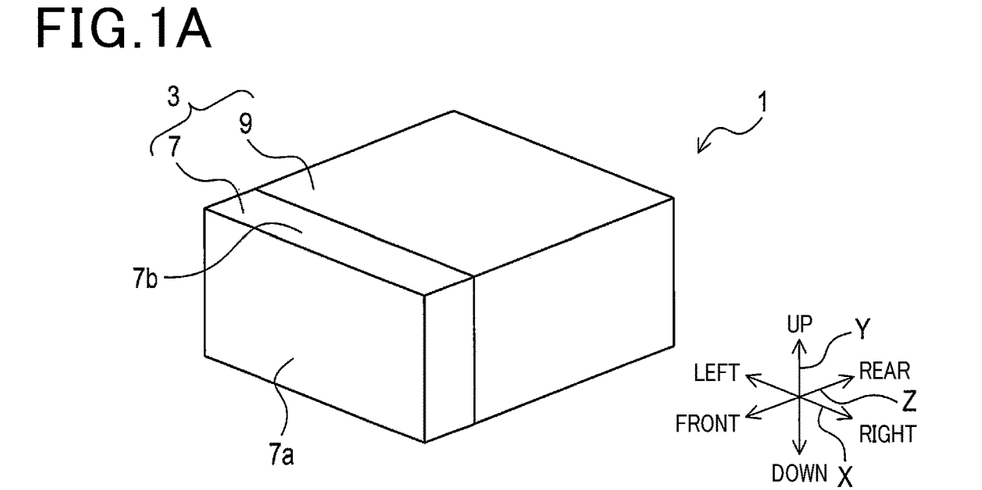
FIG. 1A is a perspective view illustrating a housing of an electronic control device according to a first embodiment.
Figure 1B:
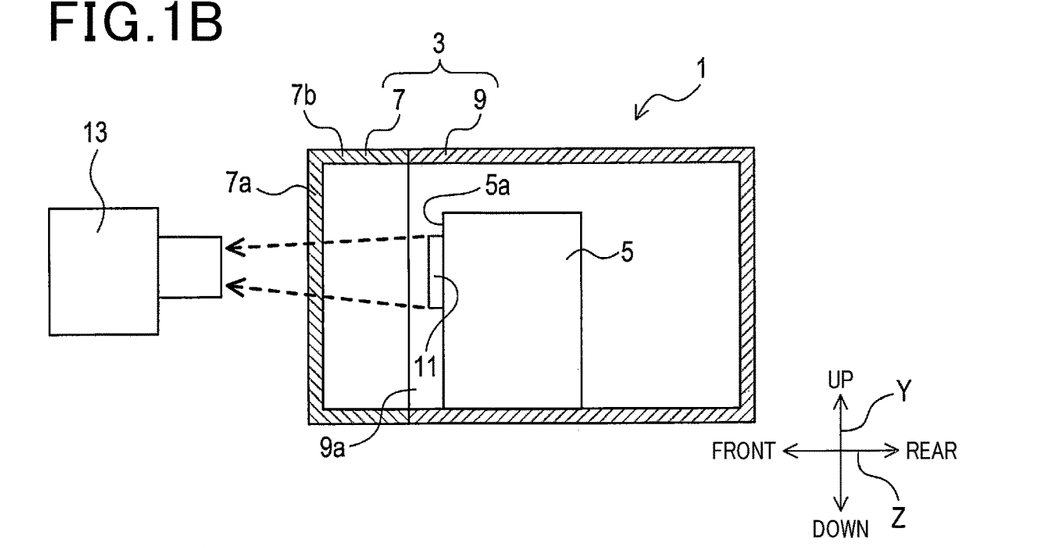
FIG. 1B is an explanatory diagram illustrating a method of reading information of the electronic control device.

As illustrated in FIG. 1A and FIG. 1B, an electronic control device 1 is an electronic device that accommodates, inside a housing 3, an electronic component 5 that performs control of a vehicle and the like. It is noted that the electronic component 5 may be, instead of a single electronic component, an electronic circuit, an assembly that is a combination of single electronic components, or the like.

Hereinafter, in FIG. 1B, the horizontal direction is defined as a Z-axis direction, the vertically direction is defined as a Y-axis direction, and the direction perpendicular to the Z axis and the Y axis is defined as an X axis direction. The left side in the Z axis direction is defined as a front side, the right side in the Z axis direction is defined as a rear side, the upper side in the Y axis direction is defined as an upper side, and the lower side in the Y axis direction is defined as a lower side. When viewed from the front side, the left side in the X axis direction is defined as a left side, and the right side in the X axis direction is defined as a right side.

The housing 3 is, for example, a rectangular parallelepiped box-shaped case surrounding the electronic component 5 and includes a selective transmission member (i.e., transmission member) 7 and a light shielding member 9.

The light shielding member 9 is, a rectangular parallelepiped box-shaped case, the front in the Z direction of which is opened. The selective transmission member 7 is a substantially rectangular cover disposed so as to cover a rectangular front opening 9a of the light shielding member 9. It is noted that the selective transmission member 7 includes a rectangular front part 7a and a belt-shaped frame part 7b vertically provided along the outer periphery of the front part 7a.

The whole housing 3 may be configured by the selective transmission member 7. In the housing 3, a plurality of light shielding members 9 and a plurality of selective transmission members 7 may be provided.

A front surface 5a of the electronic component 5, that is, the surface 5a on the selective transmission member 7 side is provided with a display part 11 on which information on the electronic control device 1 (e.g., information on the electronic component 5) is displayed. Specifically, as the display part 11, for example, a label 11L is attached.

Hence, as described later, light is emitted from a reading device (i.e., scanner) 13 to the display part 11 through the selective transmission member 7, and an image of numbers, a code, or the like displayed on the display part 11 can be read using the reflected light from the display part 11. That is, information represented by the image displayed on the display part 11 can be read.

Hereinafter, details will be described.

[1-2. Light Shielding Member]

First, the light shielding member 9 will be described.

As the light shielding member 9, a member may be employed whose transmittances with respect to three types of light, that is, ultraviolet light, visible light, and infrared light having different wavelengths, are lower than those of the selective transmission member 7. Hereinafter, ultraviolet light and infrared light may be referred to as ultraviolet rays and infrared rays, respectively.

Herein, ultraviolet light indicates light having a wavelength of approximately 1 to 380 nm (e.g., 1 nm or longer and shorter than 380 nm), visible light indicates light having a wavelength of approximately 380 to 780 nm (e.g., 380 nm or longer and shorter than 780 nm), and infrared light indicates light having a wavelength of approximately 780 nm to approximately 1 mm (e.g., 780 nm or longer and 1 mm or shorter). As the infrared light, near-infrared light having a wavelength of approximately 780 to 2500 nm (e.g., 780 nm or longer and 2500 nm or shorter) may be employed.

Materials for the light shielding member 9 include a material having a high light blocking effect such as resin (e.g., a resin to which coloring matter or the like is added) and metal, that is, a material having a low transmittance to light.

a) As the resin, polycarbonate (PC), modified polyphenylene ether (m·PPE), polyamide (PA), polyacetal (POM), polybutylene terephthalate (PBT), polyethylene terephthalate (PET), aromatic polyamide (PPA), polyphenylene sulfide (PPS), liquid crystal polymer (LCP), polysulfone (PSU), polyether sulphone (PES), polyether-imide (PEI), polyamide-imide (PAI), polyether ether ketone (PEEK), polytetrafluoroethylene (PTFE), and acrylic (PMMA) may be employed.

When such a resin is used, an appropriate additive is used to increase the light blocking effect.

For example, since adding various types of coloring matter to resins such as PET (e.g., basically transparent) and PBT (e.g., basically white) eases absorption of light, high light shielding characteristics can be obtained. An example of black coloring matter is black lead (i.e., carbon).

b) As the metal, aluminum and alloys thereof (e.g., duralumin), copper and alloys thereof (e.g., brass), iron and alloys thereof (e.g., stainless), titanium and alloys thereof, and nickel alloys may be employed.

[1-3. Selective Transmission Member]

The selective transmission member 7 transmits at least one of ultraviolet light, visible light, and infrared light, which have different wavelengths, and has selective transparency having different transmittances to light depending on the types of the light. For example, as described later, the selective transmission member 7 may be employed which has a property in which a transmittance to infrared light is higher than those to ultraviolet light and visible light.

In addition, the selective transmission member 7 has characteristics in which a transmittance to one of the above light, which is used for reading information, is higher than transmittances to the other of the above light.

That is, for example, if the selective transmission member 7 has a property in which a transmittance to infrared light is higher than that of visible light, infrared light may be used as light used for reading information. For example, as the selective transmission member 7, a member having a transmittance to visible light of 10% or lower and a transmittance to infrared light of 75% or higher.

As a material for the selective transmission member 7, at least one of glass and resin (i.e., plastic) may be employed.

For example, as described later, polycarbonate (PC), acrylic (PMMA), various types of glass, or the like may be employed.

Without using the light shielding member 9, the whole of the housing 3 may be configured by the selective transmission member 7.

<Differences Between Transmittances to Light>

Next, differences between transmittances to light of the selective transmission member 7 will be described with reference to FIG. 2A, FIG. 2B, FIG. 2C, FIG. 3A, FIG. 3B, and FIG. 3C.

In FIG. 2A, FIG. 2B, FIG. 2C, FIG. 3A, FIG. 3B, and FIG. 3C, (A) to (F) illustrate differences between transmittances of the selective transmission member 7 regarding ultraviolet light (i.e., ultraviolet rays), visible light, and infrared light (i.e., infrared rays). In each of the figures, inequality signs indicate magnitude relationships between transmittances.

Figure 2A:
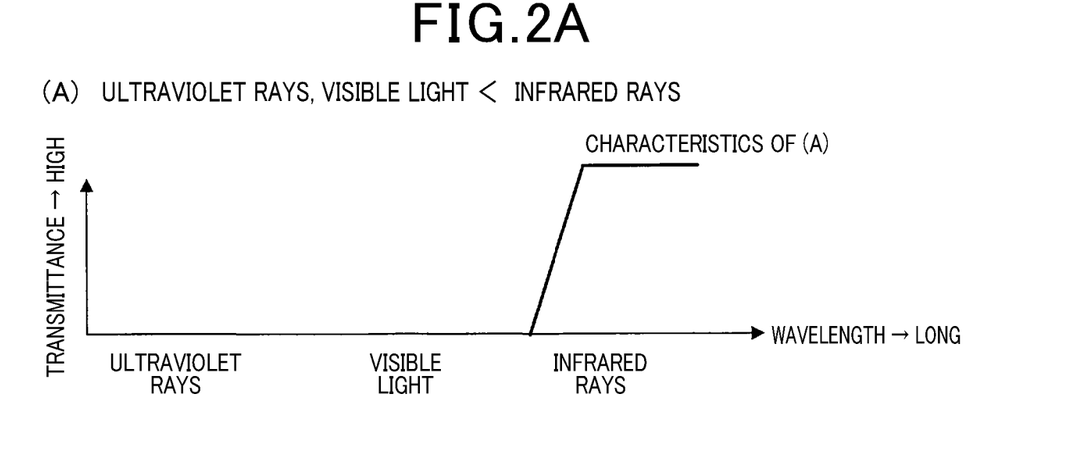
FIG. 2A, 2B, 2C are explanatory diagrams illustrating transmission characteristics of ultraviolet rays, visible light, and infrared rays of a selective transmission member.

(A) As illustrated in FIG. 2A, if "(A) ultraviolet rays, visible light<infrared rays", a transmittance to infrared rays is higher than those to ultraviolet rays and visible light. Hence, a display of the display part 11 is read using the infrared rays whose transmittance is higher (e.g., near infrared rays: and so on).

The transmittances can be achieved, for example, by adding a material obtained by compounding a green dye and/or blue dye with a red dye, which block transmission of visible light, to a resin (e.g., polycarbonate) (e.g., refer to Japanese Patent No. 2514232).

Hence, since ultraviolet rays are effectively (i.e., sufficiently) blocked, the display part 11 such as the label 1L can be suppressed from being deteriorated. In addition, if visible light is blocked sufficiently, the display part 11 becomes difficult to see in ordinary ambient light such as sunlight, whereby the design property increases.

Figure 2B:
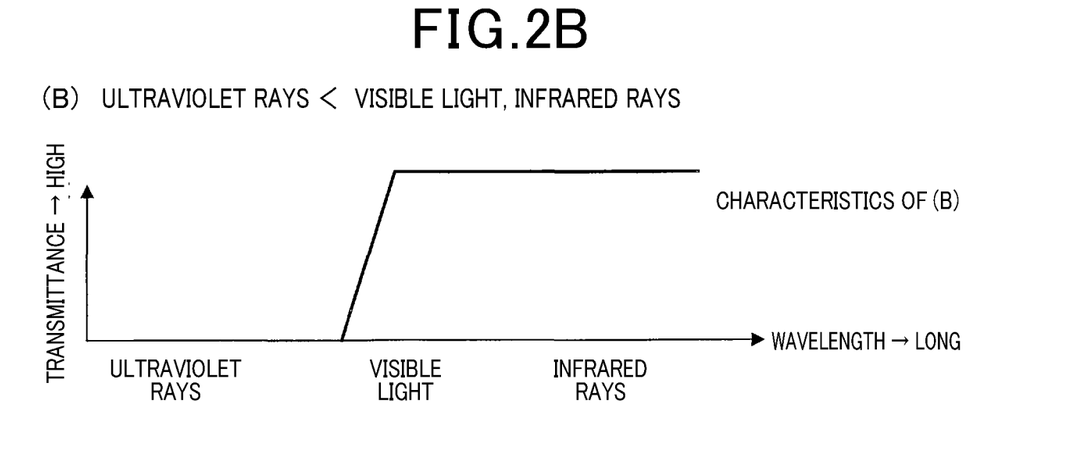

(B) As illustrated in FIG. 2B, if "(B) ultraviolet rays<visible light, infrared rays", transmittances to visible light and infrared rays are higher than that of ultraviolet rays. Hence, a display of the display part 11 is read using the visible light and the infrared rays whose transmittances are higher.

The transmittances can be achieved, for example, by coating a surface of the selective transmission member 7 using an ultraviolet ray shielding agent including titanium phosphate having an average grain diameter of 0.1 μm or smaller (e.g., refer to JP-A-10-46135) to decrease the transmittance to ultraviolet rays below the transmittances to visible light and infrared rays.

Thus, sine the ultraviolet rays are sufficiently blocked, the display part 11 can be suppressed from being deteriorated.

Figure 2C:
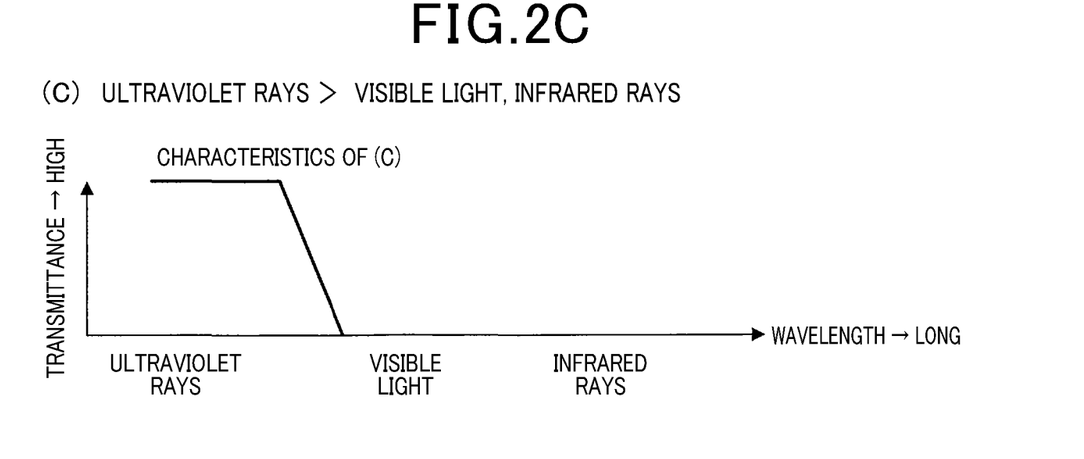

(C) As illustrated in FIG. 2C, if "(C) ultraviolet rays>visible light, infrared rays", a transmittance to ultraviolet rays is higher than those to visible light and infrared rays. Hence, a display of the display part 11 is read using the ultraviolet rays whose transmittance is higher.

The transmittance can be achieved, for example, by using a high polymer optical low-pass filter formed by diagonally cutting out an optically anisotropic high polymer material with respect to the optical axis, which increases the transmittance to the ultraviolet rays (e.g., refer to JP-A-2012-27493).

As described above, since visible light is blocked sufficiently, the display part 11 becomes difficult to see, whereby the design property increases. In addition, since infrared rays are blocked sufficiently, the temperature of the display part 11 is suppressed from increasing, whereby the display part 11 can be suppressed from being deteriorated due to the temperature.

Figure 3A:
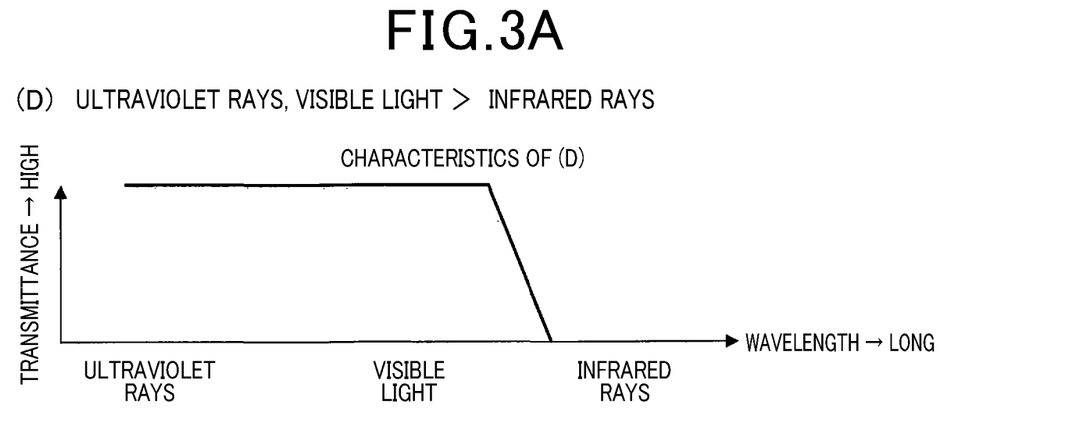
FIG. 3A, 3B, 3C are explanatory diagrams illustrating transmission characteristics of ultraviolet rays, visible light, and infrared rays of the selective transmission member.

(D) As illustrated in FIG. 3A, if "(C) ultraviolet rays, visible light>infrared rays", transmittances to ultraviolet rays and visible light are higher than that of infrared rays. Hence, a display of the display part 11 is read using the ultraviolet rays and the visible light whose transmittances are higher.

The transmittance can be implemented by suppressing infrared rays from passing through, for example, by using a thermal radiation shielding polycarbonate resin sheet formed by coating at least one side of a polycarbonate resin sheet, which has a sheet thickness of 0.2 to 10.0 mm and contains 0.001 to 0.1% by weight of lanthanum boride fine particles having an average particle diameter equal to or less than 100 nm, with a transparent resin layer having a thickness of 10 to 100 μm and containing 0.1 to 10.0% by weight of ultraviolet absorber (e.g., refer to JP-A-2005-47179).

As described above, since infrared rays are blocked sufficiently, the temperature of the display part 11 is suppressed from increasing, whereby the display part 11 can be suppressed from being deteriorated due to the temperature.

Figure 3B:
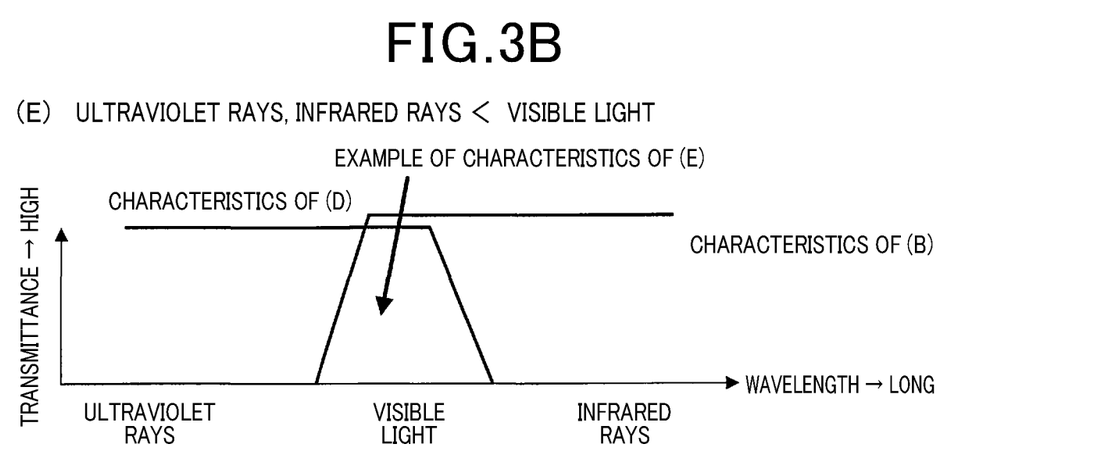

(E) As illustrated in FIG. 3B, if "(E) ultraviolet rays, infrared rays<visible light", a transmittance to visible light is higher than those to ultraviolet rays and infrared rays. Hence, a display of the display part 11 is read using visible light whose transmittance is higher.

The transmittance can be achieved by, for example, combing the techniques of the above (B) and (D).

In this case, since ultraviolet rays are sufficiently blocked, the display part 11 can be suppressed from being deteriorated. In addition, since infrared rays are blocked sufficiently, the temperature of the display part 11 is suppressed from increasing, whereby the display part 11 can be suppressed from being deteriorated due to the temperature.

Figure 3C:
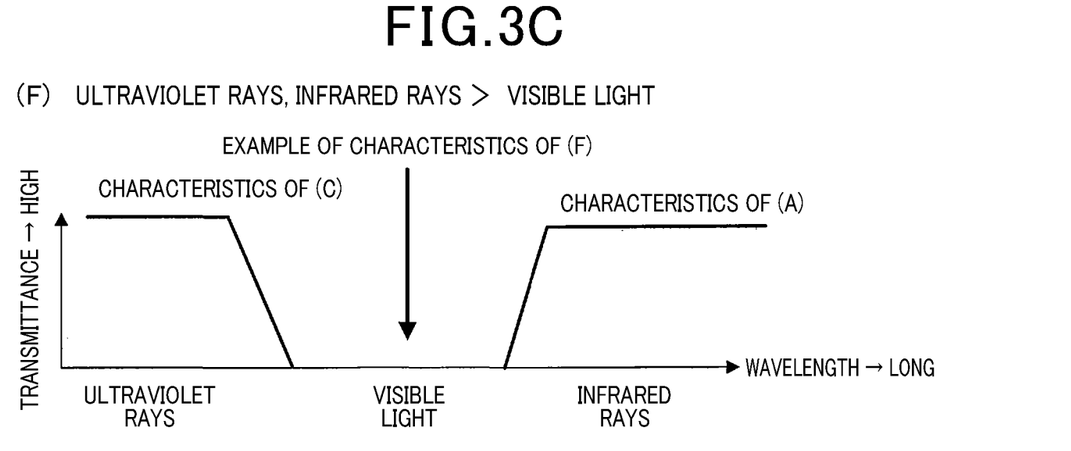

(F) As illustrated in FIG. 3C, if "(F) ultraviolet rays, infrared rays>visible light", transmittances to ultraviolet rays and infrared rays are higher than that of visible light. Hence, a display of the display part 11 is read using the ultraviolet rays and the infrared rays whose transmittances are higher.

The transmittances can be achieved by, for example, combing the techniques of the above (A) and (C).

In this case, since visible light is blocked sufficiently, the display part 11 becomes difficult to see, whereby the design property increases.

[1-4. Display Unit]

Next, the display part 11 will be described.

As illustrated in FIG. 1B, the display part 11 is disposed on the electronic component 5 or a component in the vicinity of the electronic component 5 at a distance from the housing 3.

In addition, the display part 11 is disposed at a position at which the information can be read using light that has been emitted from the reading device 13 outside the housing 3 and has passed through the selective transmission member 7.

For example, the display part 11 (i.e., the label 11L) is disposed at a position that faces the selective transmission member 7, that is, a position opposed to the front part 7a (i.e., a surface on the X-Y plane) of the selective transmission member and that is parallel to the front part 7a.

In addition, the display part 11 is configured to display the information using an image such as letters and a code provided to a surface thereof, and the image is configured so that the information can be read using the light that has passed through the selective transmission member 7.

That is, at least one of the color, the shade, and the contrast to the periphery of the image of the display part 11 is adjusted so that the information can be read using the light that has passed through the selective transmission member 7.

For example, in the present first embodiment, since the display part 11 is configured so as to have at least two reflectances with which the light that has passed through the selective transmission member 7 is reflected, the information can be read using the difference between the reflectances.

Figure 1C:
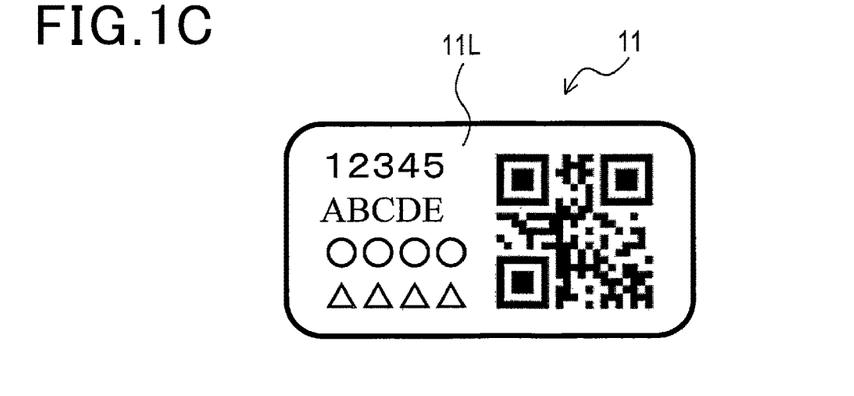
FIG. 1C is an explanatory diagram illustrating a label.

As the display part 11, the label 11L is exemplified as illustrated in FIG. 1C. It is noted that, on the surface of the label 11L, a required display is provided using at least one of letters, symbols, a bar code, and a two-dimensional code (e.g., a QR code (registered trademark), a DMC code, or the like). It is noted that the symbols (e.g., a mark or the like) do not include letters, a bar code, and a two-dimensional code.

It is noted that displays may be provided using, other than the label 11L, at least one of stamping, printing, and a laser mark.

In addition, the information displayed on the display part 11 includes at least one of the name of the manufacturer, the part number, the production time, and the information required for various legal certifications regarding the electronic control device 1 or a component such as the electronic component 5 configuring the electronic control device 1.

[1-5. Reading Device]

Next, the reading device 13 will be described.

As described above, the reading device 13 emits light, a transmittance of the selective transmission member 7 to which is higher than that of other light, through the selective transmission member 7 to read the information of the display part 11.

The reading device 13 can receive light reflected from the display part 11 through the selective transmission member 7 and read the information displayed on the display part 11 based on the received light.

In the present first embodiment, when the selective transmission member 7 has, for example, characteristics of the above "(A) ultraviolet rays, visible light<infrared rays", the information displayed on the display part 11 can be read by emitting infrared rays (e.g., near infrared rays).

It is noted that even when the selective transmission member 7 having other characteristics is used, the information can be read using light, a transmittance of the selective transmission member 7 to which is higher than that of other light.

The reading device 13 may have a configuration of, for example, a bar-code reader that can read a bar code, or a two-dimensional bar-code reader that can read a two-dimensional code (e.g., two-dimensional bar code). In addition, the reading device 13 may have a configuration of a camera that captures an image of the display part 11 and an image recognition device that can analyze the image to acquire information.

It is noted that the reading device 13 may be a known CCD system, laser system, or image scanner system. In addition, as light used for reading information, ultraviolet rays, visible light, or infrared rays may be used. That is, visible light or non-visible light may be used. It is noted that as a light source of the above light, an LED or the like may be employed.

[1-6. Information Reading Method]

Next, a method of reading information indicated on the display part 11 of the electronic control device 1 (i.e., information reading method) will be described.

In the information reading method, as described above, the reading device 13 is used to read the information displayed on the display part 11.

Specifically, the reading device 13 disposed outside the housing 3 emits light, which passes through the selective transmission member 7 and is used for reading the information displayed on the display part 11, to the display part 11 through the selective transmission member 7.

The transmittance of the selective transmission member 7 to the light used for reading the information is higher than that to other light. For example, when the selective transmission member 7 has characteristics of the above "(A) ultraviolet rays, visible light<infrared rays", the light used for reading the information is infrared rays (e.g., near infrared rays).

Then, the emitted light (e.g., near infrared light) is reflected from the display part 11. The reading device 13 receives the reflected light and uses the received light to read the information displayed on the display part 11.

[1-7. Effects]

According to the first embodiment described above, the following effects can be obtained.

(1a) In the present first embodiment, the housing 3 includes the light shielding member 9 and the selective transmission member 7. In addition, the housing 3 includes the display part 11 therein. The display part 11 is disposed on the electronic component 5 at a distance from the housing 3. In addition, the display part 11 is configured so that the information can be read using light that has been emitted from the reading device 13 and has passed through the selective transmission member 7.

Hence, according to the present first embodiment, information can be read easily (e.g., with accuracy higher than that of conventional configurations) from the display part 11.

That is, since the display part 11 is disposed inside the housing 3, the surface of the display part 11 is difficult to get dirty, a scratch, and the like. Hence, the information displayed on the display part 11 can be read using the light, which has passed through the selective transmission member 7, with accuracy higher than that of conventional configurations, that is, more reliably.

In addition, since the selective transmission member 7 has selective transparency having different transmittances to light depending on the type of light, employing light, a transmittance of the selective transmission member 7 to which is higher, to read information can read the information with high accuracy. In addition, since the transmittance of the selective transmission member 7 to light other than the light used for reading information is low, the display part 11 can be suppressed from being deteriorated due to the light.

Specifically, when the display part 11 is the label 11L, the display part 11 may peel off due to aged deterioration, or the print of the display part 11 may discolor, in the conventional art. However, according to the present first embodiment, since the label 11L is attached to the electronic component 5 in the housing 3, the above defects can be suppressed effectively.

It is noted that when designability decreases due to the attached label 11L, forming the display part 11 with marking, printing, laser marking, or the like can avoid demerits of the label 11L.

(1b) According to the present first embodiment, the display part 11 is configured so as to have at least two reflectances with which the light that has been emitted from the outside of the housing 3 and has passed through the selective transmission member 7 is reflected.

Hence, since an image indicating information on the display part 11 is clear, the information can be read with high accuracy based on the image.

(1c) In the present first embodiment, the selective transmission member 7 is characterized by having a transmittance to light, which is used for reading information, higher than transmittances to light other than the light used for reading the information.

Hence, the information can be read with high accuracy, and the display part can be suppressed from being deteriorated due to the light other than the light used for reading the information.

(1d) In the present first embodiment, the electronic control device 1 is an electronic device for a vehicle.

The electronic control device 1 installed in a vehicle is used under severe conditions. However, even when the electronic control device 1 of the present first embodiment is used under severe conditions, the display part 11 can be effectively suppressed from being deteriorated.

(1e) In the present first embodiment, the display part 11 is provided to the electronic component 5 in the housing 3.

Due the recent miniaturization of electronic components, it is difficult to ensure a place, at which required information is written, outside the housing 3. According to the present first embodiment, the place at which required information is written can be ensured easily.

(1f) According to the present first embodiment, in a production facility, a maintenance shop, a dealer, and the like of automobiles, the information displayed on the display part 11 of the housing 3 can be read easily from the outside of the housing 3 by using the reading device 13. Hence, an advantageous effect that workability improves is obtained.

2. Second Embodiment

Since the basic configuration of the second embodiment is similar to that of the first embodiment, hereinafter, differences from the first embodiment will be mainly described. It is noted that the same reference sign as that of the first embodiment indicates the same component and refers to the aforementioned description.

Figure 4A:
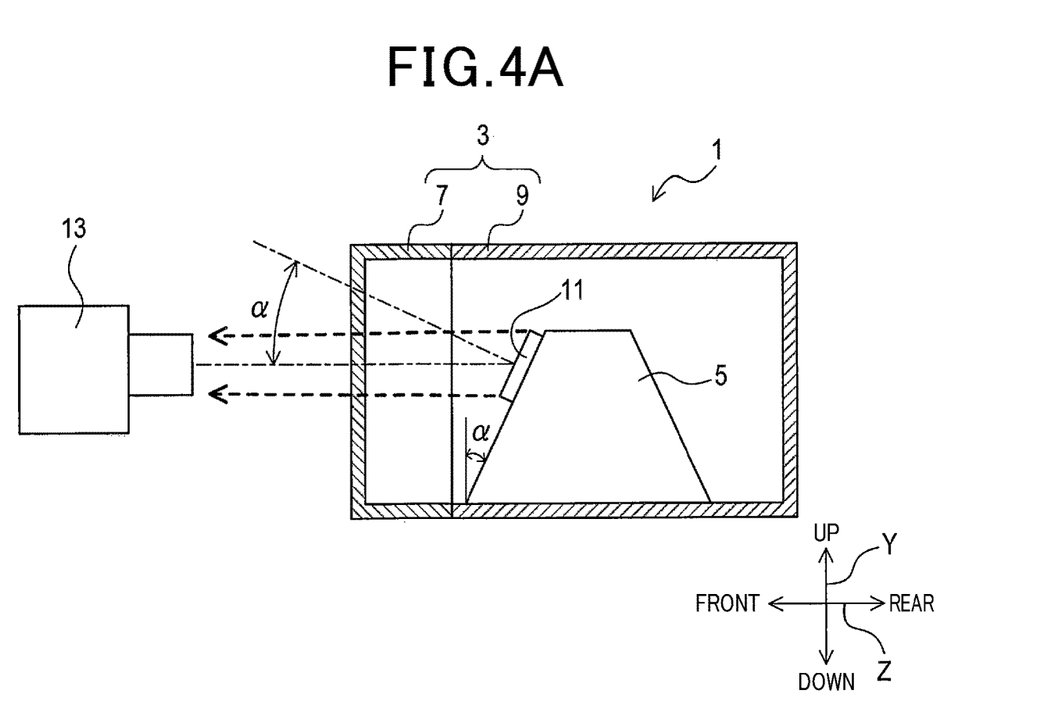
FIG. 4A, 4B are explanatory diagrams illustrating an information reading method for an electronic control device according to a second embodiment.
Figure 4B:
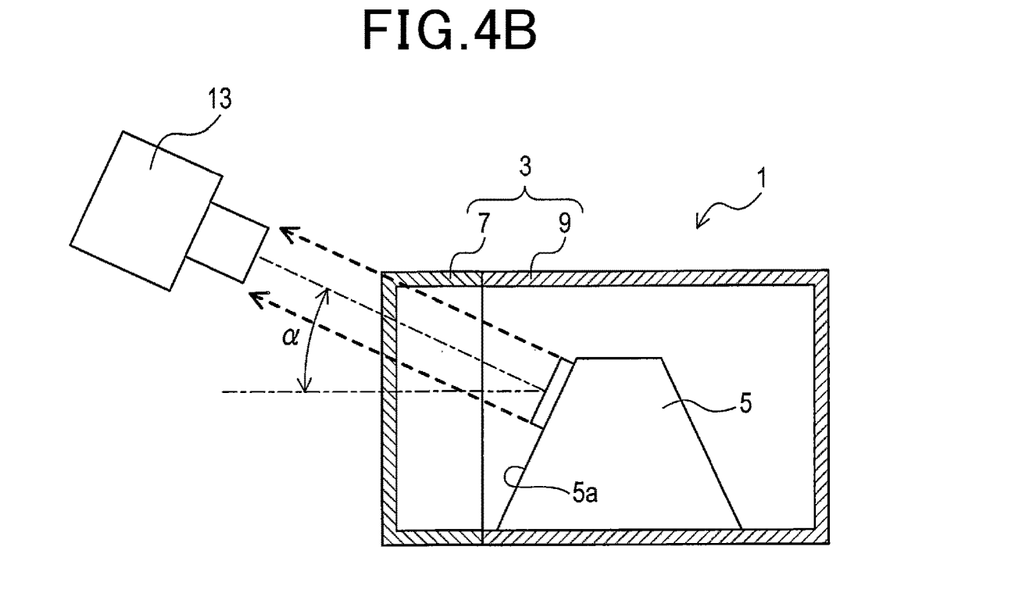

As described in FIG. 4A and FIG. 4B, the present second embodiment differs from the first embodiment in the placement of the display part 11.

Specifically, in the present second embodiment, when viewed in the X-axis direction, the front surface 5a of the electronic component on the selective transmission member 7 side (i.e., front side: left side in the figures) is inclined α° toward the rear side with respect to the Z-axis. It is noted α° may be, for example, a range of 30° or less.

In the present second embodiment, as illustrated in FIG. 4A, the reading device 13 is placed in the horizontal direction (i.e., Y-axis direction) at a height similar to that of the display part 11. The reading device 13 emits light to the display part 11 along the Y-axis direction, whereby the information displayed on the display part 11 can be read.

In addition, as illustrated in FIG. 4B, the reading device 13 is placed obliquely upward (i.e., α° upward) with respect to the display part 11, and the reading device 13 emits light α° downward to the display part 11, whereby the information displayed on the display part 11 can be read.

The present second embodiment provides effects similar to those of the first embodiment.

3. Third Embodiment

Since the basic configuration of the third embodiment is similar to that of the first embodiment, hereinafter, differences from the first embodiment will be mainly described. It is noted that the same reference sign as that of the first embodiment indicates the same component and refers to the aforementioned description.

The present third embodiment exemplifies a LiDAR device as an electronic device and will be described with reference to FIG. 5 to FIG. 7.

[3-1. Overall Configuration]

First, the overall configuration of a LiDAR device 21 will be described.

Figure 5:
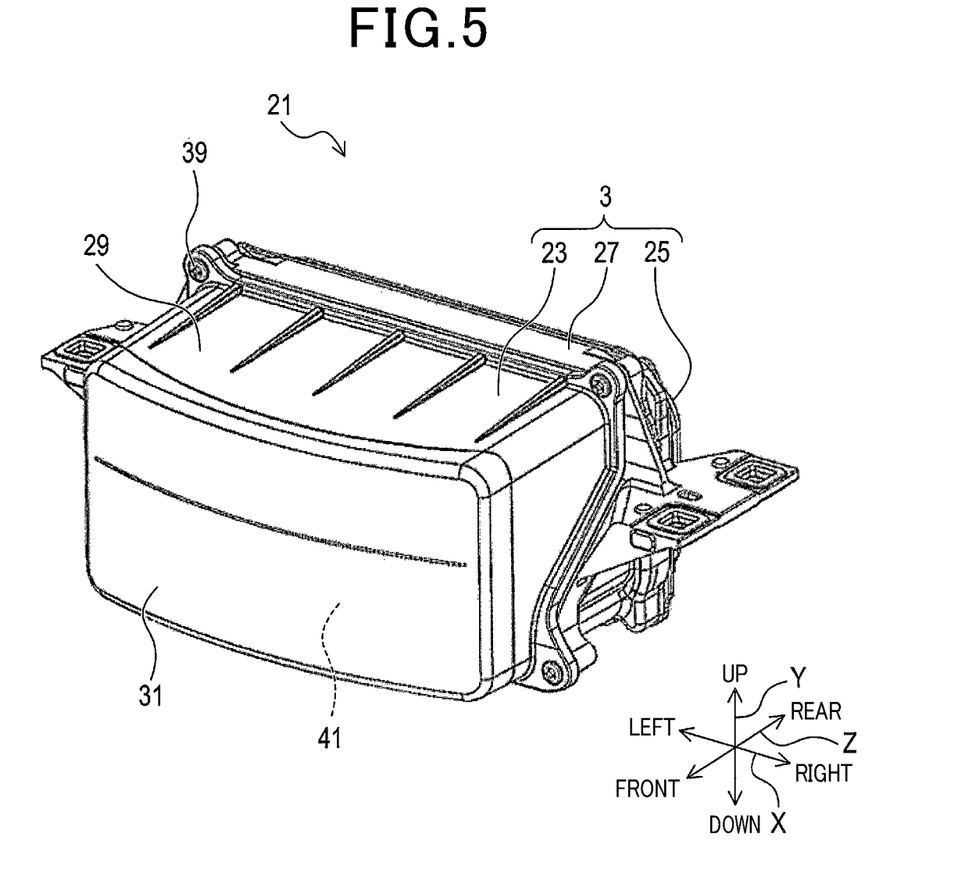
FIG. 5 is a perspective view illustrating an appearance of a LiDAR device according to a third embodiment.

The LiDAR device 21 illustrated in FIG. 5 emits laser light, and the emitted laser right is reflected from an object. The LiDAR device 21 receives the reflected light from the object to measure a distance to the surrounding object (i.e., an object to be detected).

The LiDAR device 21 is installed in a vehicle and is used for detecting various objects present, for example, ahead of the vehicle. LiDAR is an abbreviation for Light Detection and Ranging.

In the present third embodiment, the LiDAR device 21 is configured so as to deflect laser light (e.g., near-infrared light), which is non-visible light, to perform scanning. The LiDAR device 21 performs scanning with laser light, which can not only measure a distance but also determine a position. Hereinafter, laser light means the laser light used for scanning performed by the LiDAR device 21.

The LiDAR device 21 includes the housing 3 configuring part covering the whole outside of the LiDAR device 21 (i.e., outer shell part). The housing 3 includes a front housing part 23 on the front side, a rear housing part 25 on the rear side, and a middle housing part 27 between the front housing part 23 and the rear housing part 25. In addition, the front housing part 23 includes a light shielding member 29 and a selective transmission member 31 configuring an optical window.

Figure 6:
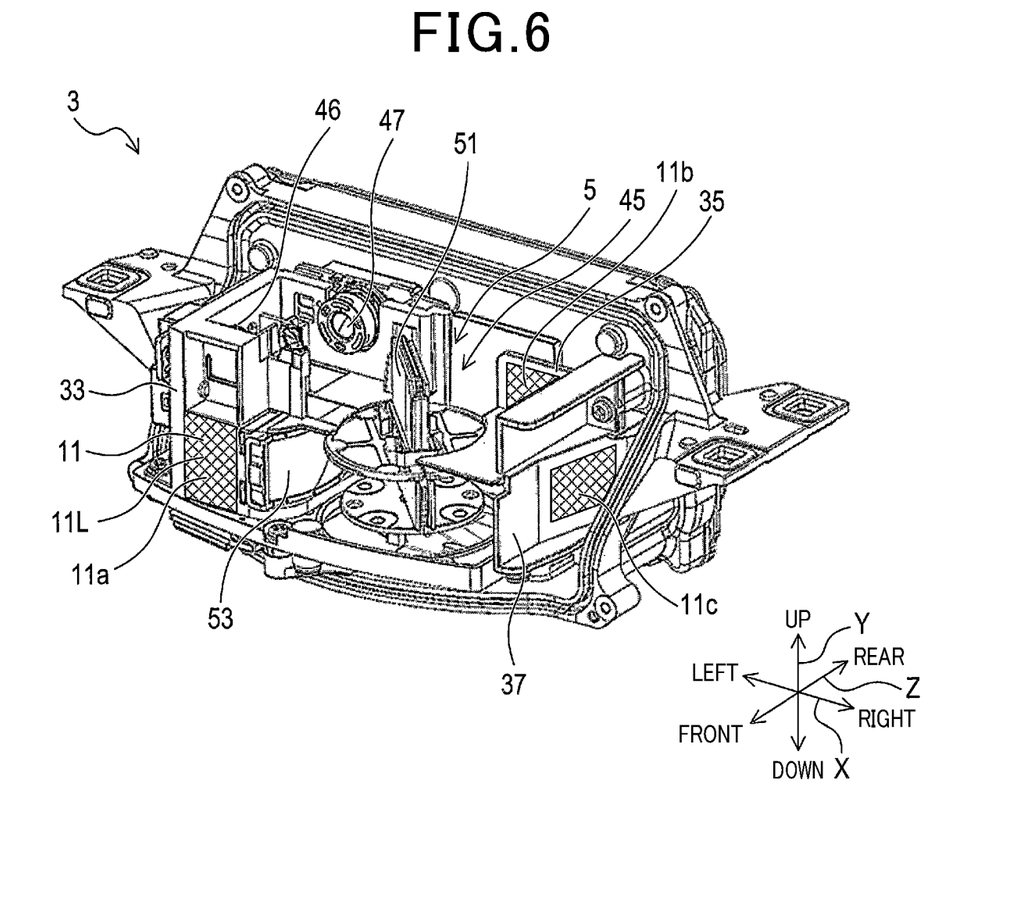
FIG. 6 is a perspective view illustrating the interior of the LiDAR device by removing a front cover of the LiDAR device according to the third embodiment.

As illustrated in FIG. 6, the housing 3 accommodates therein the electronic component 5, an inner flame 33 supporting the electronic component 5, shielding plates 35, 37, and the like.

Hereinafter, in FIG. 7, the horizontal direction is defined as an X-axis direction, the vertically direction is defined as a Z-axis direction, and the direction perpendicular to the X axis and the Z axis is defined as a Y axis direction. In FIG. 5, the near side in the Z axis is defined as a front side, the far side in the Z axis is defined as a rear side, the upper side in the Y axis is defined as an upper side, and the lower side in the Y axis is defined as a lower side. When viewed from the front side, the left side in the X axis is defined as a left side, and the right side in the X axis is defined as a right side.

[3-2. Configuration of Housing]

Next, the configuration of the housing 3 will be described.

As illustrated in FIG. 5, the housing 3 has a substantially rectangular parallelepiped shape. In the housing 3, the front housing part 23, the middle housing part 27, and the rear housing part 25 are integrally assembled with a plurality of screws 39.

The front housing part 23 is formed of, for example, resin and is integrally configured by the light shielding member 29 having a square frame shape and the selective transmission member 31 having a substantially rectangular shape with an adhesive or the like. It is noted that the selective transmission member 31 is disposed so as to cover an opening part 41 having a substantially rectangular shape on the front side of the light shielding member 29.

As the light shielding member 29, the configuration similar to that of the first embodiment may be employed. Specifically, resin or the like may be employed whose transmittance to all of light, that is, ultraviolet light, visible light, and infrared light is lower than those of the selective transmission member 7. The light shielding member 29 has a transmittance to all of the light, for example, 10% or lower.

As a material for the light shielding member 9, for example, a resin, such as polyethylene terephthalate (PET) or polybutylene terephthalate (PBT), to which, for example, black coloring matter is added may be employed to decrease the transmittance to light.

As the selective transmission member 31, the configuration similar to that of the first embodiment may be employed. For example, a resin having characteristics of the above "(A) ultraviolet rays, visible light<infrared rays" may be employed. Specifically, a material may be employed in which polycarbonate (PBC) is compounded with a dye blocking visible light from being transmitted. The selective transmission member 31 has a transmittance to infrared rays (e.g., near infrared rays) of, for example, 75% or higher.

In addition, since the LiDAR device 21 uses lase light, which is infrared light (e.g., near-infrared light), to measure, for example, a distance to the surrounding object, the transmittance to the laser light is also, for example, 75% or higher.

The middle housing part 27 and the rear housing part 25 are formed of, for example, metal such as aluminum. As in the light shielding member 29, the middle housing part 27 and the rear housing part 25 have transmittances to all of light, that is, ultraviolet light, visible light, and infrared light lower than those of the selective transmission member 31. Specifically, the middle housing part 27 and the rear housing part 25 have transmittances of, for example, 10% or lower.

It is noted that, inside the middle housing part 27 and the rear housing part 25, a control board 43 and the like (e.g., refer to FIG. 7) are disposed.

[3-3. Internal Configuration]

Next, the internal configuration of the LiDAR device 21 will be described.

It is noted that since a known configuration can be employed as the internal configuration of the LiDAR device 21, it will be described briefly.

As illustrated in FIG. 6, the housing 3 accommodates therein a known light detection module 45 as the electronic component 5, which is an assembly. It is noted that the inner flame 33 is a member that supports the light detection module 45 by fixing the light detection module 45 to the housing 3. The shielding plates 35, 37 are covers preventing stray light and the like from entering the light detection module 45 in the housing 3.

The light detection module 45 includes light emitting lenses 46, 47, a reflecting mirror 49 (e.g., refer to FIG. 7), a scanning mirror 51, a light receiving lens 53, and another reflecting mirror and a light receiving element, which are not shown.

In the present third embodiment, on the display part 11, for example, the label 11L is attached. As illustrated by meshes in FIG. 6, the label is attached to one of three display parts.

For example, a first display part 11a is disposed on the left side of the inner flame 33 in the LiDAR device 21 so that the first display part 11a faces to the front side. That is, the first display part 11a is disposed on the X-Y plane so that information can be read from the front of the LiDAR device 21.

In addition, a second display part 11b is disposed on the surface of the shielding plate 35 behind the scanning mirror 51 in the LiDAR device 21 so that the second display part 11b faces to the front side. That is, the second display part 11b is disposed on the X-Y plane so that information can be read from the front of the LiDAR device 21.

In addition, a third display part 11c is disposed on the surface on the right side of the lateral shielding plate 37 (i.e., the surface facing to the outside) in the LiDAR device 21 so that the third display part 11c faces to the right side. That is, the third display part 11c is disposed on the plane obtained by slightly turning the Y-Z plane to the front side, specifically in a clockwise direction when viewed from the above so that information can be read from the right side of the LiDAR device 21, specifically, from an angle between the front side and the right side.

[3-4. Use Method]

Next, a use method of the LiDAR device 21 will be describe.

<Measurement Method of Distance or the Like>

Figure 7:
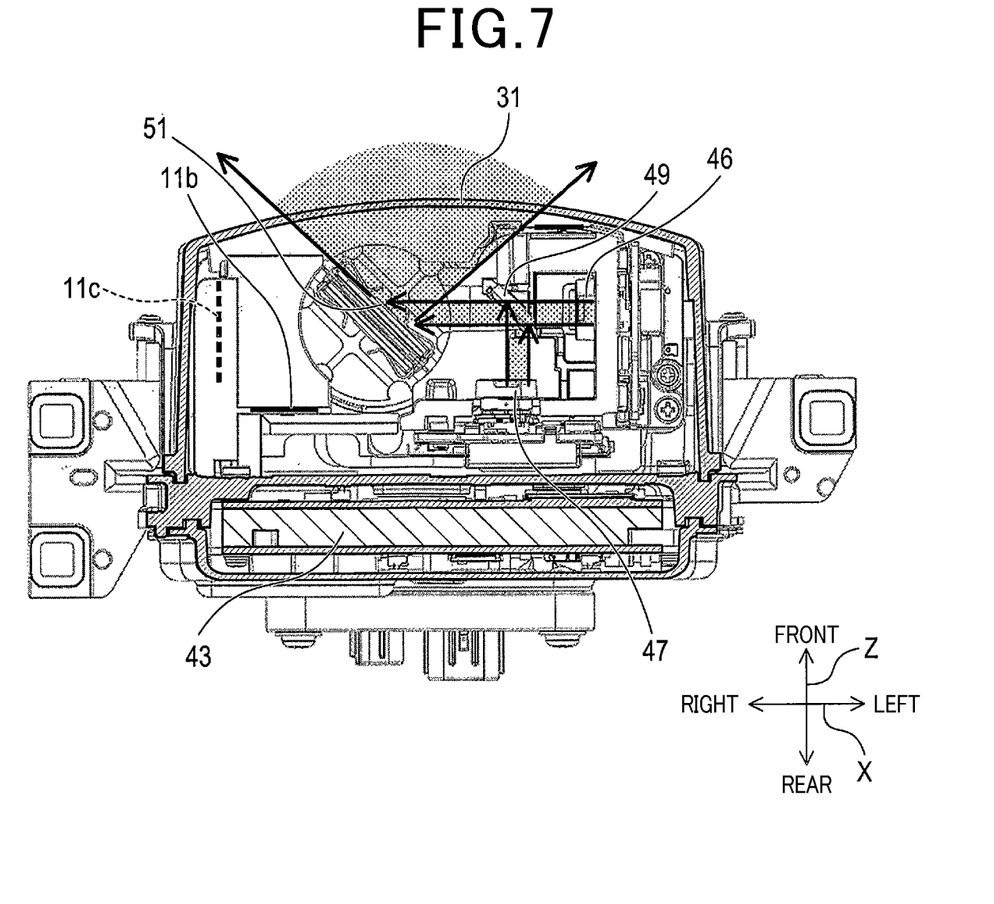
FIG. 7 is a plan view illustrating the interior of the LiDAR device by cutting away part of a housing (i.e., upper portion) of the LiDAR device according to the third embodiment.

As illustrated in FIG. 7, laser light output from the light emitting lens 46 enters the scanning mirror 51. The traveling direction of the laser light output from the other light emitting lens 47 is changed by approximately 90° by the reflecting mirror 49, and the laser light enters the scanning mirror 51. The laser light that has entered the scanning mirror 51 is emitted in the direction depending on the rotation angle of the scanning mirror 51 through the selective transmission member 31, which is an optical window. The range to which the laser light is emitted via the scanning mirror 51 (e.g., a dotted fan-shaped range) is a scanning range. For example, a range extending along the X-axis direction at ±60° in a state in which the front direction along the Z-axis is 0° may be the scanning range. It is noted that the dotted range is the range to which the laser light is emitted.

The reflected light from a predetermined direction depending on the rotational position of scanning mirror 51, that is, from a detected object located in the emitting direction of the laser light form the scanning mirror 51 passes through the optical window and is reflected by the scanning mirror 51, and is received by the light receiving element through the light receiving lens 53 and a reflecting mirror, which is not shown.

Then, a distance or the like to the detected object can be determined based on the light emitted from the light emitting lenses 46, 47 and the light received by the light receiving element.

<Method of Reading Information>

The method of reading information indicated on the display part 11 is basically similar to that of the first embodiment.

In the reading method of information, as described above, the reading device 13 is used to read the information indicated on the display part 11.

Specifically, the reading device 13 disposed outside the housing 3 emits light, which passes through the selective transmission member 31 and is used for reading the information indicated on the display part 11, to the display part 11 through the selective transmission member 31.

The transmittance to the selective transmission member 31 to the light used for reading the information is higher than that to other light. For example, when the selective transmission member 31 has characteristics of the above "(A) ultraviolet rays, visible light<infrared rays", the light used for reading the information is infrared rays (e.g., near infrared rays).

Then, the emitted light (e.g., near infrared light) is reflected from the display part 11. The reading device 13 receives the reflected light and uses the received light to read the information displayed on the display part 11.

The present third embodiment provides effects similar to those of the first and second embodiments.

4. Other Embodiments

Although embodiments of the present disclosure have been described, needless to say, the present disclosure is not limited to the above embodiments and includes various embodiments.

(4a) Not only the electronic control device but also various electronic devices accommodating an electronic component such as a sensor are included. The electronic devices may not be for vehicular use and include various electronic devices used in factories, companies, homes, or the like.

(4b) The housing is not specifically limited to the combination of a light shielding member and a selective transmission member but may include a plurality of light shielding members and selective transmission member. In addition, the light shielding member and the selective transmission member may be configured by, other than the materials described above, for example, known various materials.

(4c) Functions of a single component of the above embodiments may be implemented by a plurality of components, or a single function of a single component may be implemented by a plurality of components. Further, a plurality of functions of a plurality of components may be implemented by a single component, or a single function implemented by a plurality of components may be implemented by a single component. Furthermore, part of the configurations of the above embodiments may be omitted.

Furthermore, the configurations of the above embodiments may be combined. All of the modes included in the technical spirit specified from the wording of the claims are embodiments of the present disclosure.

An aspect of the present disclosure provides an electronic device (1) that includes a housing (3) in which an electronic component (5) is disposed.

At least part of the housing is configured by a transmission member (9) that transmits at least one of ultraviolet light, visible light, and infrared light, which have different wavelengths. The housing includes therein a display part (11) that displays information concerning the electronic device (e.g., information concerning an electronic component or an assembly).

The display part is configured to be able to read the information using any of the light that has been emitted from outside of the housing and has passed through the transmission member, and the transmission member has selective transparency having different transmittances to the light depending on a type of the light.

According to the above configuration, information on an electronic component and the like displayed on the display part can be read easily (e.g., with accuracy higher than that of conventional configurations).

That is, since the display part is disposed inside the housing, the surface of the display part is difficult to get dirty, a scratch, and the like. Hence, the information displayed on the display part can be read using the light, which has passed through the transmission member, more reliably compared with conventional configurations.

In addition, since the transmission member has selective transparency having different transmittances to light depending on the type of light, employing light, a transmittance of the transmission member to which is higher, to read information can read the information with high accuracy. In addition, since the transmittance of the selective transmission member to light other than the light used for reading information is low, the display part can be suppressed from being deteriorated due to the light.

Another aspect of the present disclosure provides an electronic device (1) that includes a housing (3) in which an electronic component (5) is disposed.

At least part of the housing is configured by a transmission member (9) that transmits at least one of ultraviolet light, visible light, and infrared light, which have different wavelengths. The housing includes therein a display part (11) that displays information concerning the electronic device (e.g., information concerning an electronic component or an assembly).

The display part is configured to be able to read the information using any of the light that has been emitted from outside of the housing and has passed through the transmission member. The display part is disposed on the electronic component or a component (33, 35, 37) in the vicinity of the electronic component at a distance from the housing and is disposed at a position at which the information is able to be read from outside of the housing.

According to the above configuration, information on an electronic component and the like displayed on the display part can be read easily (e.g., with accuracy higher than that of conventional configurations).

That is, the electronic component or the component in the vicinity of the electronic component is disposed inside the housing. The display part is disposed on the electronic component or the component in the vicinity of the electronic component at a distance from the housing. In addition, information displayed on the display part can be read by using the light that has been emitted from outside of the housing and has passed through the transmission member.

Hence, the surface of the display part disposed inside the housing is difficult to get dirty, a scratch, and the like. Hence, the information displayed on the display part can be read easily using the light that has passed through the transmission member.

What is claimed is:

1. An electronic device that includes a housing in which an electronic component is disposed, wherein
    at least part of the housing is configured by a transmission member that transmits at least one of ultraviolet light, visible light, and infrared light, which have different wavelengths,
    the housing includes therein a display part that displays information concerning the electronic device,
    the display part is configured to be able to read the information using any of the light that has been emitted from outside of the housing and has passed through the transmission member, and
    the transmission member has selective transparency having different transmittances to the light depending on a type of the light,
    wherein
    the electronic device is for vehicular use and is installed in a vehicle.

2. The electronic device according to claim 1, wherein
    the display part is disposed on the electronic component or a component in the vicinity of the electronic component at a distance from the housing and is disposed at a position at which the information is able to be read from outside of the housing.

3. The electronic device according to claim 2, wherein
    the transmission member has selective transparency having different transmittances to the light depending on a type of the light.

4. The electronic device according to claim 1, wherein
    the display part is configured so as to have at least two reflectances with which any of the light that has been emitted from outside of the housing and has passed through the transmission member is reflected.

5. The electronic device according to claim 1, wherein
    the transmission member has characteristics in which a transmittance to one of the light, which is used for reading the information, is higher than a transmittance to the other of the light.

6. An electronic device that includes a housing in which an electronic component is disposed, wherein
    at least part of the housing is configured by a transmission member that transmits at least one of ultraviolet light, visible light, and infrared light, which have different wavelengths,
    the housing includes therein a display part that displays information concerning the electronic device,
    the display part is configured to be able to read the information using any of the light that has been emitted from outside of the housing and has passed through the transmission member, and
    the transmission member has selective transparency having different transmittances to the light depending on a type of the light,
    wherein
    the transmission member has characteristics in which a transmittance to the infrared light or the ultraviolet light is higher than a transmittance to the visible light.

7. An electronic device that includes a housing in which an electronic component is disposed, wherein
at least part of the housing is configured by a transmission member that transmits at least one of ultraviolet light, visible light, and infrared light, which have different wavelengths,
the housing includes therein a display part that displays information concerning the electronic device,
the display part is configured to be able to read the information using any of the light that has been emitted from outside of the housing and has passed through the transmission member, and
the transmission member has selective transparency having different transmittances to the light depending on a type of the light,
wherein
the electronic device senses a condition in the vicinity thereof using light, and
the transmission member has transmittances to light for sensing the condition and to light for reading the information higher than a transmittance to the visible light.

8. The electronic device according to claim 1, wherein the transmission member is configured by at least one of glass and plastic.

9. The electronic device according to claim 1, wherein the display part is configured by at least one of labeling, marking, printing, and laser marking.

10. An electronic device that includes a housing in which an electronic component is disposed, wherein
at least part of the housing is configured by a transmission member that transmits at least one of ultraviolet light, visible light, and infrared light, which have different wavelengths,
the housing includes therein a display part that displays information concerning the electronic device,
the display part is configured to be able to read the information using any of the light that has been emitted from outside of the housing and has passed through the transmission member, and
the transmission member has selective transparency having different transmittances to the light depending on a type of the light,
wherein
the information displayed on the display part is at least one of a name of a manufacturer, a part number, production time, and information required for various legal certifications regarding the electronic device or a component configuring the electronic component.

11. The electronic device according to claim 1, wherein the display part provides display using at least one of letters, symbols, a bar code, and a two-dimensional code.

12. An electronic device that includes a housing in which an electronic component is disposed, wherein
at least part of the housing is configured by a transmission member that transmits at least one of ultraviolet light, visible light, and infrared light, which have different wavelengths,
the housing includes therein a display part that displays information concerning the electronic device,
the display part is configured to be able to read the information using any of the light that has been emitted from outside of the housing and has passed through the transmission member, and
the transmission member has selective transparency having different transmittances to the light depending on a type of the light,
wherein
the display part is disposed at an angle at which the information is able to be read from outside of the housing by using a reading device.

13. A display part used for the electronic device according to claim 1, wherein
the display part is configured to display the information by an image provided to a surface thereof, and the image is configured to be able to read the information by the light that has been emitted from outside of the housing and has passed through the transmission member.

14. The display part according to claim 13, wherein
at least one of a color, shade, and a contrast to the periphery of the image of the display part is adjusted so as to be able to read the information using the light that has passed through the transmission member.

15. An information reading method for the electronic device, which reads information displayed on the display part of the electronic device according to claim 1, wherein
the information displayed on the display part is read by emitting light passing through the transmission member to the display part from outside of the housing through the transmission member.

16. The information reading method for the electronic device according to claim 15, wherein
a transmittance of the transmission member to one of the light used for reading the information displayed on the display part is higher than that to other light.

17. The information reading method for the electronic device according to claim 15, wherein
a reading device disposed outside the housing emits the light, which passes through the transmission member, to the display part through the transmission member, receives reflected light that is the emitted light reflected by the display part, and reads the information displayed on the display part by using the received light.

18. The electronic device according to claim 4, wherein
the display part is disposed on the electronic component or a component in the vicinity of the electronic component at a distance from the housing and is disposed at a position at which the information is able to be read from outside of the housing.

* * * * *